(12) United States Patent
Guenter

(10) Patent No.: US 8,154,030 B2
(45) Date of Patent: Apr. 10, 2012

(54) INTEGRATED DIODE IN A SILICON CHIP SCALE PACKAGE

(75) Inventor: James K. Guenter, Garland, TX (US)

(73) Assignee: Finisar Corporation, Sunnyvale, CA (US)

( * ) Notice: Subject to any disclaimer, the term of this patent is extended or adjusted under 35 U.S.C. 154(b) by 52 days.

(21) Appl. No.: 11/118,179

(22) Filed: Apr. 29, 2005

(65) Prior Publication Data

US 2006/0071229 A1 Apr. 6, 2006

Related U.S. Application Data

(60) Provisional application No. 60/615,474, filed on Oct. 1, 2004.

(51) Int. Cl.
*H01L 31/153* (2006.01)
(52) U.S. Cl. ............................... 257/81; 257/84; 257/98
(58) Field of Classification Search .................... 257/81, 257/82, 98, 99, 101, 684, 84
See application file for complete search history.

(56) References Cited

U.S. PATENT DOCUMENTS

| | | | | |
|---|---|---|---|---|
| 5,793,785 A | * | 8/1998 | Nakanishi et al. | 372/36 |
| 5,793,790 A | * | 8/1998 | Doi et al. | 372/50.1 |
| 5,920,587 A | * | 7/1999 | Narui et al. | 372/50.1 |
| 6,037,644 A | * | 3/2000 | Daghighian et al. | 257/444 |
| 6,449,296 B1 | * | 9/2002 | Hamasaki et al. | 372/36 |
| 6,459,711 B1 | * | 10/2002 | Hamaguchi et al. | 372/36 |
| 6,657,235 B1 | * | 12/2003 | Verdonk et al. | 257/80 |
| 2003/0053498 A1 | * | 3/2003 | Hamasaki et al. | 372/36 |
| 2004/0021144 A1 | * | 2/2004 | Schrodinger | 257/81 |
| 2005/0121686 A1 | * | 6/2005 | Keller et al. | 257/99 |
| 2005/0275079 A1 | * | 12/2005 | Stark | 257/680 |
| 2005/0286593 A1 | * | 12/2005 | Guenter | 372/50.21 |
| 2006/0071225 A1 | * | 4/2006 | Beeson et al. | 257/98 |
| 2006/0192221 A1 | * | 8/2006 | Zhou et al. | 257/98 |

* cited by examiner

*Primary Examiner* — Wael Fahmy
*Assistant Examiner* — Abul Kalam
(74) *Attorney, Agent, or Firm* — Maschoff Gilmore & Israelsen

(57) ABSTRACT

An optical component with integrated back monitor photodiode. The optical component includes a substrate doped with a first type dopant, such as an n-type dopant. The substrate has a trench with sloped walls. An optical source is disposed in the trench. An implant of a second type dopant, such as a p-type dopant, is in the substrate around at a least a portion of the optical source. The implant in the substrate in combination with the first type dopant in the substrate forms a diode.

15 Claims, 3 Drawing Sheets

INTEGRATED DIODE IN A SILICON CHIP SCALE PACKAGE

CROSS-REFERENCE TO RELATED APPLICATIONS

This application claims the benefit of U.S. Provisional Application No. 60/615,474, titled "Integrated Back Monitor Photodiode In a Silicon Ship Scale Package" filed Oct. 1, 2004, which is incorporated herein by reference.

BACKGROUND OF THE INVENTION

1. The Field of the Invention

The invention generally relates to the field of optical transmitters. More specifically, the invention relates to optical transmitters packaged with integrated diodes.

2. Description of the Related Art

Modern day computer networks allow for transmissions of large amounts of data between computer terminals. Data may be transmitted on a network across a number of different mediums. For example, data may be transmitted across traditional copper wire based cables. However, copper wire based cables are subject to limitations that are making them less attractive as a solution for many modern networks. Specifically, the copper wire based cables are limited in the amount of data they can carry in a given time period and the length that the data can travel. As computer technology continues to increase in the amount of data that can be produced in a given time period, other types of cable with higher capacities and longer transmission distances may be desirable.

One type of cable that is capable of higher data transmission rates over longer distances is fiber-optic cable. Fiber-optic cables are plastic or stretched glass cables that carry data signals in the form of light. Light signals can propagate on fiber-optic cables at higher speeds and for longer distances than electronic signals on copper wire based cables. Further, fiber-optic cables are potentially lighter weight and less expensive that their copper based counterparts. Thus, fiber-optic cables are steadily becoming a more popular choice for communication networks.

While fiber-optic data signal are optical or light signals, data signals at computer terminals generally continue to be electronic data signals. The electronic data signals being sent by a computer terminal are therefore converted using an electro-optical transducer, such as a laser diode or light emitting diode (LED) that converts the electronic data signals to corresponding optical data signals. To receive a signal from a fiber-optic network, a computer terminal converts the optical data signal to a corresponding electronic signal using an opto-electronic transducer, such as a photodiode and post-amplifier.

A laser diode emits laser light at varying power levels when a varying power level electronic signal is applied to anode and cathode terminals of the laser diode. Thus a modulated optical signal can be produced directly from a corresponding modulated electronic data signal using a laser diode. There is however, often a need to control or monitor the actual power being output by a laser diode or LED. Digital optical signals are often required to be within a certain power level. Thus, there may be a need to measure the amount of power being output by a laser diode or LED and to control that power. It may also be beneficial to monitor the output power of a laser diode or LED to ensure that the laser diode or LED is functioning. Still other reasons may exist for monitoring laser diode and LED power.

Accordingly, some discrete optical sources such as laser diodes and LEDs are packaged with discrete back monitor photodiodes. A back monitor photodiode measures optical power transmitted in a path in which the back monitor photodiode lies (e.g. the output of a laser diode or LED). Alternatively, a back monitor photodiode may measure optical power that is reflected off of the packaging or other external reflection causing elements. Thus the back monitor photodiode receives a small portion of the actual power that is generated. The amount of power detected by the back monitor photodiode is then scaled to approximate the amount of power produced by the optical source.

Unfortunately, current designs suffer from several drawbacks. For example, the use of discrete components results in inconsistencies in how the back monitor photodiode receives optical power. Further, packaging and/or other external elements that reflect light are typically not configured to reflect light into a back monitor photodiode. Thus, any power reflected back into the back monitor photodiode is not regulated or controlled and in some environments is at least partially random. Additionally, the small size of the back monitor photodiode represents a reduced area for incident reflected power.

What would be useful therefore is a back monitor photodiode with a substantial surface area. Further it would be useful to incorporate a package that directed more reflected power into the back monitor photodiode. Further still, it would be useful if the cost of the optical source and back monitor photodiode can be reduced.

Another challenge that is experienced in laser devices such as Vertical Cavity Surface Emitting Lasers (VCSELs) relates to Electrostatic Discharge (ESD) damage. Exposure to ESDs is one very common cause of VCSEL failure. Further, the smaller an aperture of emission in the VCSEL, the lower the amount of ESD voltage a VCSEL can withstand. As an example, a VCSEL with a aperture diameter of about 5 microns may be damaged when ESD levels are on the order of about 100V using a human ESD model. Smaller apertures are often used in single mode VCSELs. Thus single mode VCSELs may be more susceptible to ESDs than other types of VCSELs To protect devices from electrostatic discharge, external components may be used to limit the amount of current through a component or to provide an alternate path for the discharge. However, using external components significantly increases the total size of packaging needed. This may be less desirable when there is a need or advantage to having smaller component packaging. Therefore, what would be new and useful is electrostatic discharge protection that can be implemented without significantly increasing the size of components.

BRIEF SUMMARY OF THE INVENTION

One embodiment includes an optical component. The optical component includes a substrate doped with a first type dopant, such as an n-type dopant. The substrate has a trench with sloped walls. An optical source is disposed in the trench. An implant of a second type dopant, such as a p-type dopant, is in the substrate around at a least a portion of the optical source. The implant in the substrate in combination with the first type dopant in the substrate forms a diode.

Another embodiment includes a chip scale wafer. The chip scale wafer includes a substrate doped with a first type dopant such as an n-type dopant. The substrate includes a number of trenches with sloped walls. Optical sources, such as lasers and LEDs, are disposed in the trenches. An implant of a second type dopant, such as a p-type dopant are implanted in the substrate around at a least a portion of each optical source. The implant in the substrate forms at least a portion of one or more diodes.

Another embodiment includes a method of making an optical component with a back monitor photodiode. The method includes forming trenches with sloped walls in a substrate doped with a first dopant type. Optical sources are placed in the trenches. A second dopant type is implanted in the substrate around the trenches to form a diode.

Advantageously, the embodiments described above include large back monitor photodiodes to provide for more surface area where optical energy can be sensed. Additionally, the sloped trench walls help to direct light energy into the photodiodes. Alternatively, the embodiments summarized above may be used to integrate a protection diode in the same structure as an optical source. This allows for manufacturing optical sources with integrated ESD protection.

These and other advantages and features of the present invention will become more fully apparent from the following description and appended claims, or may be learned by the practice of the invention as set forth hereinafter.

BRIEF DESCRIPTION OF THE SEVERAL VIEWS OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE INVENTION

One embodiment described herein relates to an optical source, such as a laser diode or LED, which is formed in a package that may also include a back monitor photodiode or an integrated protection diode. Specifically, the package is formed from a semiconductor substrate. A sloped wall trench formed in the semiconductor substrate using an etching process. An optical source is placed in the trench either as a discrete component or through an epitaxial process. A back monitor photodiode is formed around the optical source in the trench or on the underside of the substrate. A protection diode may be formed in the substrate. The protection diode may be formed under the optical source, or in any other convenient location. The protection diode does not need to be formed such that it receives any reflected or otherwise transmitted light from the optical source.

In one embodiment, the semiconductor substrate is an n-type material, and the back monitor photodiode or protection diode is formed by implanting a p-type material in the semiconductor substrate to create a p-n junction for the back monitor photodiode or protection diode. Alternatively, the semiconductor substrate may be a p-type material and an n-type implant may be formed in the semiconductor substrate. The sloped walls of the trench may be formed so as to increase the amount of power reflected from the optical source that is reflected onto the back monitor photodiode.

Figure 1:
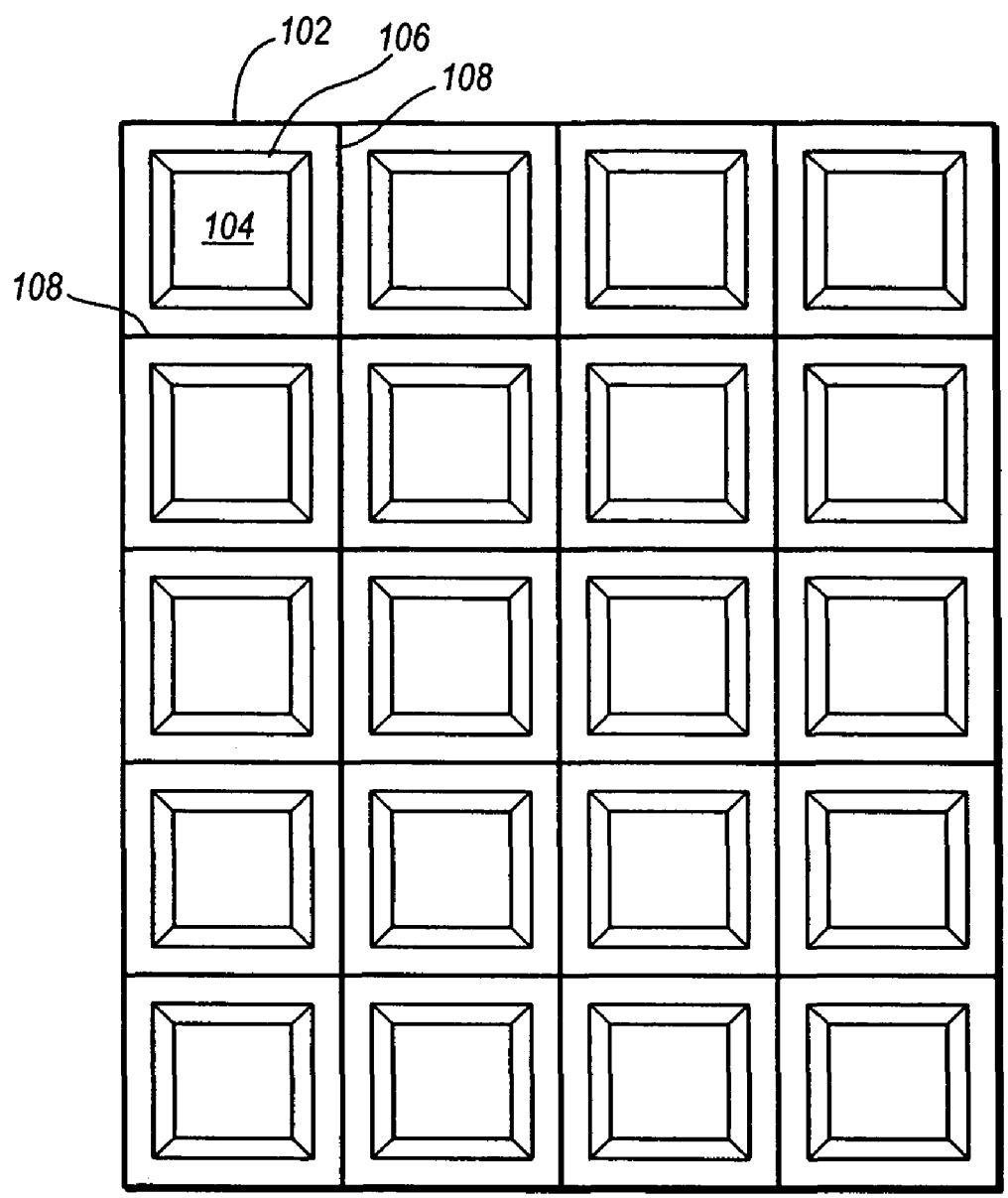
FIG. 1 illustrates an array of wafer packages that may be employed in some embodiments of the invention.

FIG. 1 depicts an exemplary chip-scale packaging in accordance with principles of the present invention. FIG. 1 illustrates a portion of a semiconductor wafer where trenches 104 have been formed in a semiconductor substrate 102. The trenches 104 may be formed, for example, by a wet etch process. The wet etch process causes walls 106 of the trench 104 to be sloped. By controlling the etchants used in the wet etch process, the angle of the slope of the walls 106 can be controlled. As will be discussed in more detail herein, a back monitor photodiode or protection diode may be formed on the bottom of the trench 104. The slope of the walls 106 can be sloped at an angle to optimize the amount of optical energy that is reflected onto the bottom of the trench 104 where the back monitor photodiode is formed. A sheet of glass a sheet may be placed over the trenches 104. The sheet of glass may be epoxied to the substrate 102 so as to seal the trenches 104. The sheet of glass may be formed such that it forms lenses over each of the trenches 104 for focusing light emitted from optical sources in the trenches 104.

Alternatively, the sheet of glass may be hermetically sealed to the substrate by a member of other processes. For example, fusion bonding and soldering may be used.

Fusion bonding includes acts that cause the glass sheet and substrate 102 to fuse together. The glass sheet and substrate 102 are placed between two probes. A moderate pressure is applied. The fusion is performed at a moderate temperature of about 100° C. A high electric field is applied, which is accomplished by supplying a voltage to the probes. The conditions described above cause diffusion to occur at the interface of the glass sheet and the substrate 102. This results in a hermetic seal.

An alternative method of hermetically sealing relates to acts that accomplish soldering of the glass sheet and the substrate 102 together. In this example, metal is deposited on an upper portion of the substrate. Mating metal structures are deposited on the glass sheet. The substrate 102 and glass sheet are then soldered together to create a hermetic seal.

As shown in FIG. 1, several trenches 104 may be formed in a semiconductor substrate 102 and later sawed along saw lanes 108 to form portions of discrete optical source-back monitor photodiode or protection diode packages. Thus, packages can be formed in a chip scale process where multiple chip packages can be formed simultaneously.

Figure 2A:
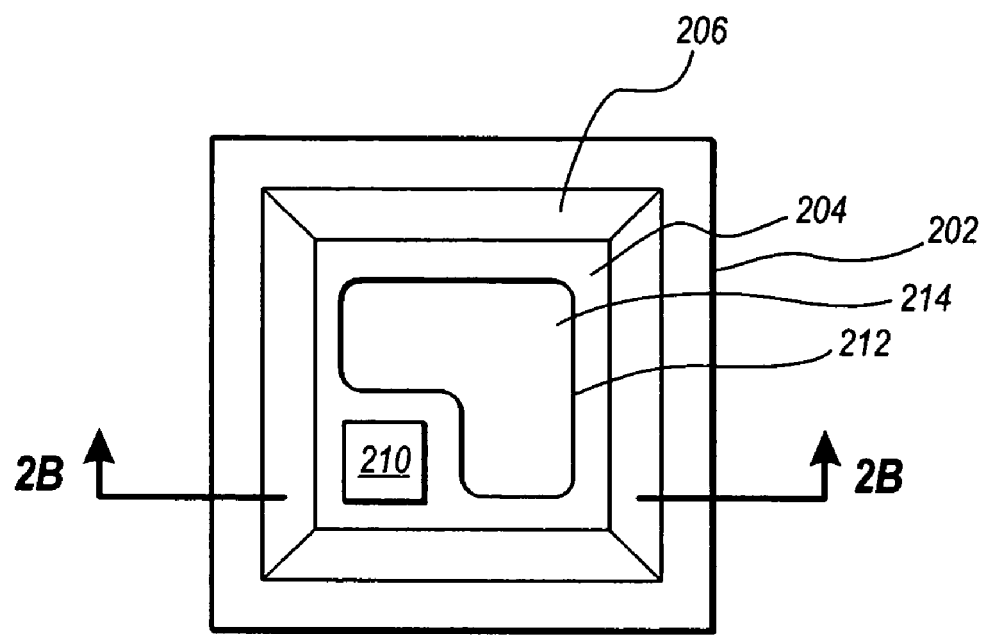
FIG. 2 illustrates a top view and a side cutaway view of one embodiment of a package including a laser diode and back monitor photodiode.
Figure 2B:
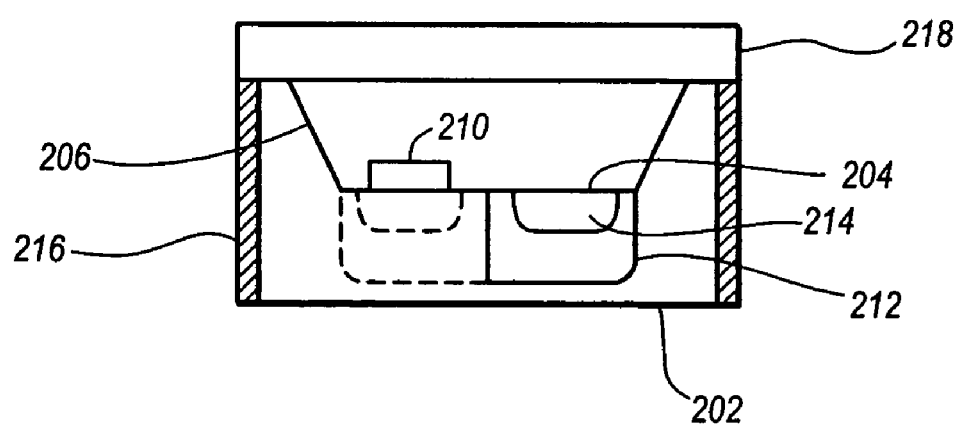

Referring now to FIG. 2, an example of an optical source 210 packaged with a back monitor photodiode 212 is shown. In this example, the optical source 210 may be formed on the bottom of the trench 204. The optical source 210 may be a discrete component that is placed into the trench 204 and secured using epoxy or by another suitable method. Alternatively, the optical source 210 may be formed through an apitaxial process including various deposition and photolithographic steps.

In the embodiment shown in FIG. 2, a back monitor photodiode 212 is formed in the substrate 202 where the trench 204 is formed. In the example shown, the substrate 202 may be a doped material such as an n-type doped semiconductor material. For example, if the substrate 202 is a Gallium Arsenide (GaAs) material, the substrate may be doped with silicon to produce an n-type substrate 202. To form the back monitor photodiode, a p-type material 214, such as carbon is implanted into the n-type substrate 202 forming a p-n junction of the back monitor photodiode 212.

In the example shown in FIG. 2, the p-type material is implanted in areas around the optical source 210. This creates a back monitor photodiode 212 with a large surface area for receiving optical power reflected from the optical source 210. While the example in FIG. 2 is illustrated with an n-type substrate 202 and a p-type implant 212, it should be understood that a p-type substrate and an n-type implant may be used in other embodiments.

FIG. 2 also illustrates an isolation implant 216. The isolation implant 216 is formed around the optical source 210 and photodiode 212 to electrically isolate these components. This may be done for example to isolate an integrated optical source and photodiode package from other packages such as when packaging is done on a chip scale as shown in FIG. 1. While an isolation implant 216 is shown, in other embodiments, an additional shallow trench may be used to electrically isolate the optical source 210 and the back monitor photodiode 212. The shallow trench may be formed, for example, by using a wet etch process. The shallow trench may be formed, in one example, external to the trench 204 in the location of the isolation implant 216. While FIG. 2 illustrates an example where a back monitor photodiode 212 is used, other embodiments may implement a protection diode in place of the back monitor photodiode 212.

FIG. 2 also illustrates a glass lens 218 that may be attached to the semiconductor substrate 202. The glass lens 218 may serve various optical focusing functions and the like. Additionally, the glass lens 218 may be attached to the semiconductor substrate 202 to hermetically seal the trench 204.

Figure 3A:
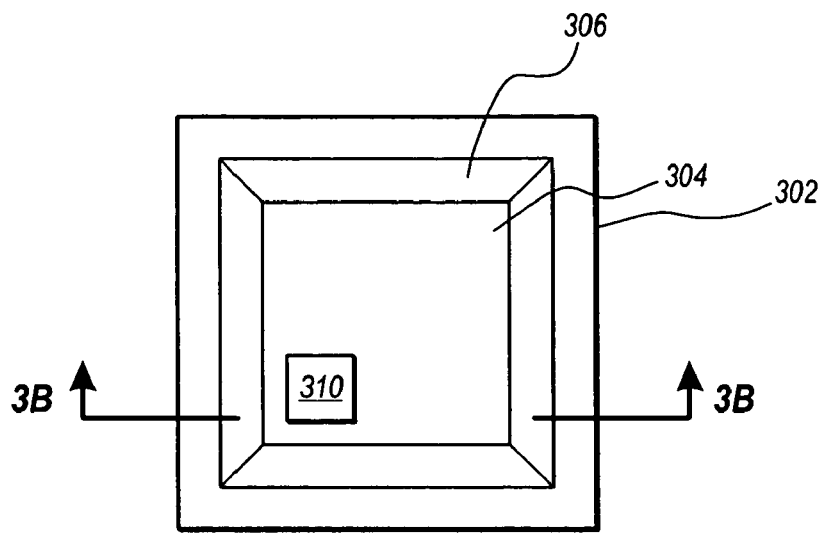
FIG. 3 illustrates a top view and a side cutaway view of another embodiment of a package including a laser diode and back monitor photodiode.
Figure 3B:
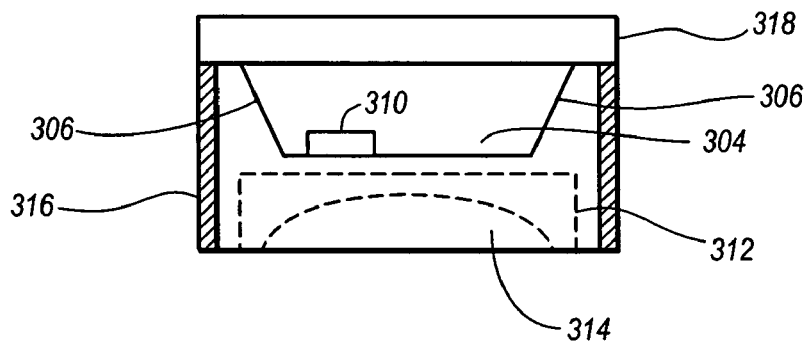

Referring now to FIG. 3, an alternate embodiment is shown. In the embodiment shown in FIG. 3, an optical source 310 is placed in a trench 304 formed on a semiconductor substrate 302 in a manner similar to that shown in FIG. 2. In this example, however, the semiconductor substrate 302 is an n-type substrate and a p-type implant 314 is formed from the underside of the semiconductor substrate 302 to form the back monitor photodiode 312. The example shown in FIG. 3 also includes sloped walls 306 to maximize reflection onto the back monitor photodiode 312. As in FIG. 2, a glass lens 318 may be attached to the substrate 302 to focus light and/or provide a hermetic seal for the trench 304.

To implement embodiments where a protection diode is included, the structures shown above are fabricated such that the optical source, which may be a laser or photodiode, is connected to the protection diode so as to provide protection from electrostatic discharges (ESDs). Connections may be accomplished by using methods and systems such as those described in U.S. patent application Ser. No. 11/091,179 titled "Vertical Cavity Surface Emitting Laser with Integrated Electrostatic Discharge Protection" filed Mar. 28, 2005, which is incorporated herein by reference. One exemplary embodiment includes a structure that includes ESD protection provided by a Zener diode.

Figure 4:
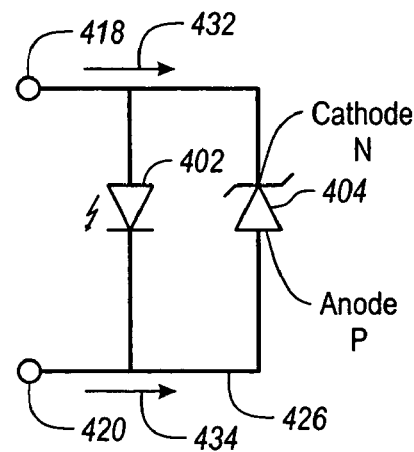
FIG. 4 is a schematic illustrating the circuit of one example embodiment.

Referring now to FIG. 4, an illustrative example of one embodiment is shown. A protection diode 404 shown in FIG. 4 includes a heavily doped p layer and a heavily doped n layer. These may be formed as a doped substrate similar to the substrate 302 (or other appropriate substrates) and/or an implant similar to the implant 314 (or other appropriate implants). In one embodiment, the heavily doped n layer may be doped on the order of $10^{18}$ to $10^{19}$ atoms/cm³.

As is illustrated in FIG. 4, various interconnections are made so as to create an appropriate circuit topology for protecting an optical source 402. The embodiment shown in FIG. 4 is a two terminal device meaning that two leads 418, 420 are externally accessible for providing bias and signal voltages to the optical source 402. A first lead 418 is connected to the optical source 402 anode through a metal deposition contact formed on or near the anode of the optical source 402. A second lead 418 is connected to the optical source 402 cathode and the protection diode 404 anode through a metal deposition contact.

A common connection 426 is shown between the cathode of the protection diode 204 and the anode of the optical source 402. This common connection may be accomplished in several different ways. For example, metal depositions may be used in the fabrication process to form the common connection 426. Alternatively, wire bonding may be used to connect a metal deposition formed on the under side of a substrate to a metal deposition contact formed on or near the optical source 402 anode.

The protection diode 404 may be formed axially in the vertical axis directly below the optical source 402. Other configurations may also be implemented. In particular, the protection diode 404 may be formed in a region not directly under the optical source 402 in the vertical axis. By forming the protection diode 404 in a region removed from the 402 there is more flexibility in controlling characteristics of the protection diode 404. For example, characteristics of the protection diode 404 can be controlled by controlling the size and shape of the protection diode 404. As a part of forming the protection diode 404, an isolation barrier may be formed or implanted in the n+ layer and the p+ layer. The isolation barrier is used to define the edges, and thus the size of the protection diode 404.

A reverse biased ESD traveling in a reverse bias direction 234, on the optical source 402 will pass through the protection diode 404. This is because in the reverse bias direction 434, the path through the forward biased protection diode 404 is an easier path to travel. This provides reverse bias ESD protection to the optical source 404. Reverse bias ESDs are among the most harmful ESDs to VCSEL junctions.

In many embodiments, it is beneficial to tailor the protection diode 404 to optimize it for use in protecting the optical source 402 from forward biased ESDs. For example, the optical source 402 may be designed such that it has a voltage drop of 1.5 volts and an in-line impedance of about 20 to 200Ω. If a protection diode is fabricated using a design similar to one used for an integrated photodiode, such as those illustrated in U.S. patent application Ser. No. 10/877,915 titled Light Emitting Device With an Integrated Monitor Photodiode, the protection diode 204 may have a reverse bias breakdown voltage, a voltage where current flows somewhat freely in the reverse bias direction shown as direction 432, of around 30V. Thus, while the protection diode 404 may provide some protection from forward biased ESDs onto the optical source 402 damage may still result to the optical source 402 because current is not significantly sourced away from the optical source 402 below 30V.

One way of optimizing the protection diode 404 for better protection of the VCSEL is by increasing the doping in the n type layer such that it is heavily doped. Such doping may be for example in the range of $10^{18}$ to several times $10^{19}$ atoms per cm³. Higher doping in the n type layer correlates directly to lower breakdown voltages in the protection diode 404. In one embodiment, it may be desirable to design a protection diode with a breakdown voltage of about 3V, and a series resistance of about 20Ω or less. The protection diode 404, in this example, functions as a Zener diode.

While the protection diode 404 has been optimized for use in protecting the optical source 402, it may also be used as a monitor photodiode when the need for ESD protection has been reduced or abated. A three terminal device may include ESD protection functionality and photodiode monitoring functionality depending on the interconnection (or non-interconnection) of the terminals.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. An optical component comprising:
    a substrate including a top surface with a trench having a bottom surface and one or more side walls defined by the substrate;
        an optical source disposed within the trench at the bottom surface and between the one or more side walls;
        a monitor photodiode disposed within the trench at the bottom surface and between the one or more side walls and at least partially surrounding the optical source in the trench and positioned adjacent to the optical source so as to be configured to receive a reflected portion of an optical output from the optical source; and
    a lens covering the trench, wherein the lens is positioned over the optical source and the monitor photodiode.

2. The optical component of claim 1, further comprising an isolation implant around the optical source and the monitor photodiode to electrically isolate the optical source and the monitor photodiode.

3. The optical component of claim 1, further comprising a shallow trench around the optical source and the monitor photodiode to electrically isolate the optical source and the monitor photodiode.

4. The optical component of claim 1, wherein the optical source is a discrete component epoxied to the bottom surface of the trench.

5. The optical component of claim 1, wherein the optical source is an epitaxial structure epitaxially grown on the substrate within the trench.

6. The optical component of claim 1, wherein the substrate is GaAs.

7. The optical component of claim 1, wherein the lens hermetically seals the trench.

8. The optical component of claim 7, wherein the hermetic seal is provided by a fusion bond.

9. The optical component of claim 7, wherein the hermetic seal is provided by a solder.

10. The optical component of claim 1, wherein a portion of the substrate in the trench is doped with an n-type dopant and the monitor photodiode includes a p-type dopant implanted in the n-type doped portion of the substrate.

11. The optical component of claim 1, wherein a portion of the substrate in the trench is doped with a p-type dopant and the monitor photodiode includes an n-type dopant implanted in the p-type doped portion of the substrate.

12. The optical component of claim 1, wherein the trench has sloped walls.

13. A chip scale wafer comprising:
    a substrate including a top surface with a plurality of trenches formed therein, each trench having a bottom surface and one or more side walls defined by the substrate;
    an optical source disposed within each of the trenches at the bottom surface and between the one or more side walls;
    a plurality of monitor photodiodes, each monitor photodiode disposed within a trench of the plurality of trenches at the bottom surface and between the one or more side walls and at least partially surrounding a corresponding one of the optical sources in the corresponding trench and positioned adjacent to the corresponding one of the optical sources; and
    a lens covering each trench, wherein each lens is positioned over a corresponding one of the optical sources, and each monitor photodiode is positioned and configured to receive a reflected portion of an optical output of a corresponding one of the optical sources.

14. The chip scale wafer of claim 13, wherein a sheet of glass disposed over the trenches forms the lens covering each trench and is coupled to the substrate so as to seal the trenches.

15. An optical component comprising:
    a substrate comprising a top surface having a trench with an opening formed therein, the trench having a bottom surface and one or more side walls defined by the substrate;
    a glass lens attached to the top surface and covering the opening of the trench;
    an optical source epitaxially grown in the trench at the bottom surface and between the one or more side walls; and
    a monitor photodiode epitaxially grown in the bottom surface of the trench between the one or more side walls, wherein the monitor photodiode is in areas at least partially surrounding the optical source and optically coupled to the optical source for receiving optical power from the optical source via a reflected optical path.

* * * * *